(12) United States Patent
Reilly et al.

(10) Patent No.: US 6,948,864 B2
(45) Date of Patent: Sep. 27, 2005

(54) OPTOELECTRONIC COMPONENT WITH THERMOELECTRIC TEMPERATURE CONTROL

(75) Inventors: Declan Reilly, Ipswich (GB); Simon Meadowcroft, Stowmarket (GB)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/936,367

(22) Filed: Sep. 8, 2004

(65) Prior Publication Data
US 2005/0058406 A1 Mar. 17, 2005

(30) Foreign Application Priority Data
Sep. 16, 2003 (GB) ................................................ 0321653

(51) Int. Cl.⁷ ................................................ G02B 6/36
(52) U.S. Cl. .............................. 385/92; 385/14; 385/88
(58) Field of Search ............................. 385/14, 88, 89, 385/92, 94, 123, 24

(56) References Cited

U.S. PATENT DOCUMENTS

| 4,733,932 A | * | 3/1988 | Frenkel et al. ................. 385/92 |
| 5,663,556 A | * | 9/1997 | Wessels et al. ........... 250/214.1 |
| 5,966,941 A | | 10/1999 | Ghoshal ....................... 62/3.7 |
| 2002/0121094 A1 | | 9/2002 | VanHoudt ....................... 62/3.3 |
| 2003/0044128 A1 | * | 3/2003 | Crane et al. ................... 385/92 |
| 2003/0152132 A1 | * | 8/2003 | Pipe et al. .................. 374/137 |
| 2004/0184494 A1 | * | 9/2004 | Harker et al. ................. 372/36 |
| 2005/0058406 A1 | * | 3/2005 | Reilly et al. .................. 385/88 |

* cited by examiner

Primary Examiner—Brian M. Healy

(57) ABSTRACT

An optoelectronic device, for example a laser diode transmitter or receiver module is disclosed having thermoelectric control of the operating temperature of the device.

11 Claims, 3 Drawing Sheets

OPTOELECTRONIC COMPONENT WITH THERMOELECTRIC TEMPERATURE CONTROL

FIELD OF THE INVENTION

The present invention relates to an optoelectronic device, for example a laser diode transmitter or receiver module, having thermoelectric control of the operating temperature of the device.

DISCUSSION OF THE BACKGROUND ART

Many types of optoelectronic device need to be operated at a controlled temperature. For example, a laser diode based fibre optic transmitter device may have a laser diode which is capable of operating over a range of temperatures between 0° C. to 80° C.

In some applications, the operating temperature of an optoelectronic device may need to be carefully controlled. For example, a laser diode used in a transmitter unit as part of a wavelength division multiplexing (WDM) fibre optic communications system operating at around 850 nm to 1600 nm wavelength, may need to have a wavelength stability of within ±2 nm or better, depending on the number and spacing of different optical wavelengths to be carried by the fibre optic system. If wavelengths drift outside the specified ranges, then there will be cross-talk between adjacent channels in the WDM system.

In order to maintain wavelength stability within the required range, it is necessary to stabilise the laser diode operating temperature. An optoelectronic device mounted within an optoelectronic component may need to be cooled, for example, owing to excess heat generated within the component or heating from other electrical equipment in proximity with the component. Cooling of an optoelectronic device is conventionally done by mounting the optoelectronic device on a thermoelectric cooler, which pumps heat away from the device, for example to heat fins on an external surface of the component. A conventional example of such an optoelectronic component would be a laser transmitter module for a fibre optic transmission link, in which the laser is rated to operate at a relatively low controlled temperature of 30° C. regardless of the external temperature of the module, which then may vary over a specified range of 0° C. to 85° C.

A problem arises in that for some types of optoelectronic component there are de facto industry standards on the total maximum allowable electrical power consumption. In particular, the Small Form-Factor Pluggable (SFP) Transceiver Multisource Agreement (MSA), which includes transceivers with transmission rates up to 5 Gbit/sec, operating over single mode and multimode fibre, specifies a maximum electrical power consumption of 1 W. Several other MSA's e.g. XFP, SFF, Gbic, Xenpak, Xpak, and X2, specify varying levels of electrical power consumption. Such standards are necessary to maintain interchangeability between similar components manufactured by different sources. There are also industry standards on the package size and configuration of such components, necessary to ensure that similar components from different manufacturers are plug-compatible. Such physical constraints limit the amount of passive cooling that may be afforded by heat sinks or cooling fins. Maximum rated temperatures may therefore be considerably less than 85° C.

Because the power consumption of a thermoelectric cooler increases non-linearly, depending on the temperature difference across which heat is pumped, the maximum rated external temperature for an optoelectronic having a maximum rated electrical power consumption depends mainly on the rated operating temperature the optoelectronic device within the component. In recent years, there has therefore been a trend to using optoelectronic devices such as laser diodes, which are designed to operate at higher temperatures. This has permitted the maximum rated operating temperature of some optoelectronic components to be increased, for example, to between 0° C. and 70° C.

In recent years there has also been a move towards dense WDM systems, which may have 40 wavelength channels or more. Such systems require better than ±20 pm wavelength control on each channel, and this places increased burdens on the precision of the required temperature control within an optoelectronic component. This in turn tends to limit the maximum operating temperature of an optoelectronic component, which must operate within a constrained electrical power and/or physical size.

It is an object of the present invention to provide an optoelectronic component with thermoelectric temperature control, which deals with these issues.

SUMMARY OF THE INVENTION

Accordingly, the invention provides an optoelectronic component, comprising a housing, an optoelectronic device, a thermoelectric device, and a heat sink for dissipating heat from the component, the optoelectronic device and thermoelectric device being mounted within the housing and the thermoelectric device being thermally bound to the optoelectronic device, wherein the thermoelectric device is operable in both a heating and a cooling mode in order to stabilise the operating temperature of the optoelectronic device, and the component includes a variable thermal link, said link being disposed between the thermoelectric device and the heat sink and said link being operable to control a variable thermal coupling between the thermoelectric device and the heat sink, such that the thermal coupling is reduced when the thermoelectric device is used to stabilise the operating temperature of the optoelectronic device by heating the optoelectronic device and relatively increased when the thermoelectric device is used to stabilise the operating temperature of the optoelectronic device by cooling the optoelectronic device.

The invention therefore facilitates the use of an optoelectronic component having an optoelectronic device that is designed to operate at a relatively high temperature relative to the environment surrounding the component. When the surrounding environment is relatively cool compared with the component, and the electrical power consumption of the optoelectronic device is insufficient to raise the operating temperature of the optoelectronic device to a desired operating temperature, as may be necessary for example to stabilise the optical wavelength in a WDM system, then the thermoelectric device may be operated in a heating mode to raise the temperature of the optoelectronic device to the desired operating temperature while at the same time the variable thermal link reduces the thermal coupling between the thermoelectric device and the heat sink to reduce heat loss to the heat sink.

Commercially available thermoelectric devices when used for heating have a greater efficiency at converting electric input power into heat than when used for cooling. In general, lower electrical power consumption is required to stabilise the operating temperature of an optoelectronic device when the thermoelectric device is used for heating rather than cooling. The result is that it then becomes possible to stabilise the operating temperature of the optoelectronic device over a greater specified ambient temperature range for the optoelectronic component, for a given maximum electrical power consumption, as compared to the achievable temperature range for an optoelectronic component in which the thermoelectric device is used only in cooling mode.

As described above, the variable thermal link is also operable to control the variable thermal coupling between the thermoelectric device and the heat sink in such a way that the thermal coupling is increased when the thermoelectric device is used to cool the optoelectronic device. Therefore, the invention therefore also facilitates the use of the optoelectronic device when the component is surrounded by an environment in which the optoelectronic device would otherwise be heated above the desired operating temperature in the absence of thermoelectric cooling. When operating in the cooling mode, the variable thermal link serves to conduct pumped heat from the thermoelectric device to the heat sink.

The optoelectronic component may comprise additionally a temperature sensor and a controller. The temperature sensor may then be arranged to sense the temperature of the optoelectronic device, and the controller may be arranged to receive a signal from the temperature sensor and to control in response to said received signal the operation of the variable thermal link in order to control the operating temperature of the optoelectronic device.

The heat sink may serve to deliver heat or to expel heat from the component, depending on the operating temperature of the component or optoelectronic device and the surrounding environment.

The heat sink may be provided by at least a portion of the housing. In a basic embodiment of the invention, the heat sink is simply the housing itself, which may radiate or absorb thermal energy. For example, the heat sink may comprise air cooling fins projecting from an external surface of the housing.

In order to make a good thermal connection, the thermoelectric device may be joined, bonded or otherwise connected, directly to an external surface of the optoelectronic device.

The variable thermal link may include at least one movable feature, which moves between a first position in which the thermoelectric device is relatively thermally isolated from the heat sink to a second position in which the thermoelectric device is relatively thermally connected to the heat sink.

The variable thermal link may comprise a movable leaf which moves to provide the variable thermal coupling between the thermoelectric device and the heat sink.

In one embodiment, the variable thermal link is passively operable to control the variable thermal coupling between the thermoelectric device and the heat sink. In an alternative embodiment the variable thermal link is actively operable to control the variable thermal coupling between the thermoelectric device and the heat sink.

The optoelectronic component may comprise an actuator for moving the movable feature. The actuator may comprise part or all of the movable feature In one embodiment, the actuator comprises a piezoelectric element. In an alternative embodiment, the actuator comprises a bimetallic strip.

In order help insulate the optoelectronic device, while at the same time still providing a secure mounting within the housing, the optoelectronic device and/or the thermoelectric device may be secured to the housing via a thermally insulating component.

Also according to the invention, there is provided a method of operating an optoelectronic component at a stabilised operating temperature, said component comprising a housing, an optoelectronic device, a thermoelectric device, a heat sink, a variable thermal link, and a source of electrical power, the optoelectronic device and thermoelectric device being mounted within the housing, the thermoelectric device being thermally bound to the optoelectronic device and the variable thermal link being disposed between the thermoelectric device and the heat sink, the method comprising the steps of:

i) supplying electrical power to run the optoelectronic device;

ii) supplying electrical power the thermoelectric device such that said device is operated in a heating mode to heat the optoelectronic device and stabilise the operating temperature of the optoelectronic device when the temperature of the optoelectronic device is below a desired level;

iii) supplying electrical power the thermoelectric device such that said device is operated in a cooling mode to cool the optoelectronic device and stabilise the operating temperature of the optoelectronic device when the temperature of the optoelectronic device is below a desired level;

iv) using the variable thermal link to control a variable thermal coupling between the thermoelectric device and the heat sink, such that the thermal coupling is relatively reduced when the thermoelectric device is used to heat the optoelectronic device and relatively increased when the thermoelectric device is used to cool the optoelectronic device.

v) using the heat sink to dissipate heat from the thermoelectric device when the thermoelectric device is used to cool the optoelectronic device and when the variable thermal coupling is relatively increased.

BRIEF DESCRIPTION OF THE DRAWINGS

The invention will now be further described, by way of example only, with reference to the accompanying drawings, in which.

DETAILED DESCRIPTION OF THE PREFERRED EMBODIMENT

Figure 1:
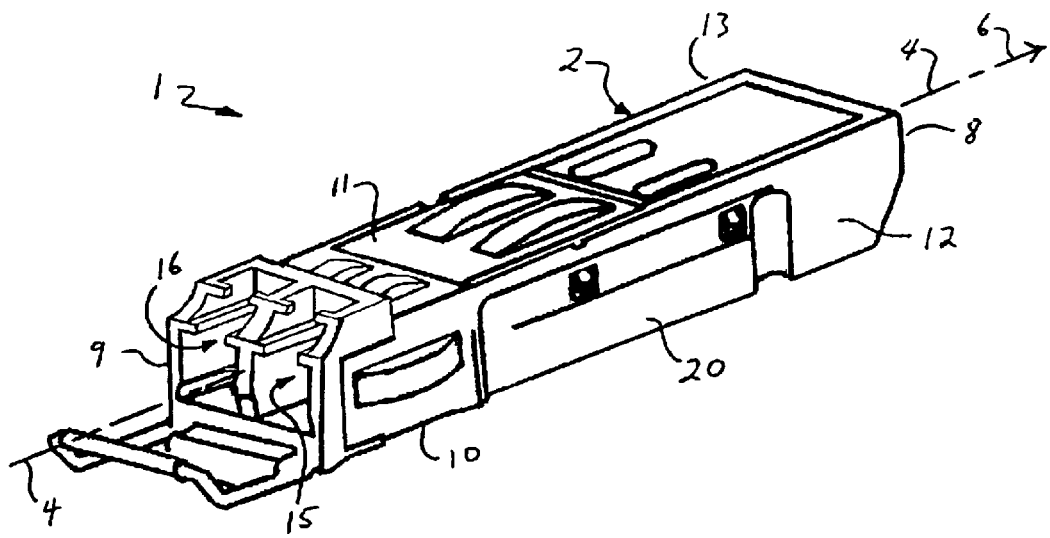
FIG. 1 is a perspective view of the exterior of an optoelectronic component according to a first embodiment of the invention.

FIG. 1 shows a perspective view of the exterior of an optoelectronic component 1 according to a first embodiment of the invention. The component is an optical fibre transmitter unit for an optical fibre transmission link operating at between 850 nm and 1600 nm. The component 1 has an elongate rectangular box shape that extends along an axis 4. The component 1 would normally be inserted along an insertion direction 6 parallel to the axis 4 into a matching receptacle in a cabinet or rack (not shown), together with other similar transmit or receive units as part of an optical fibre transmission system. Such components 1 are normally plug-compatible with similar such components available from multiple sources. There are approximately 10 different industry standards, relating to 10 differently sized packages and functionality. The present example shows a component commonly referred to as an SFP package, although the invention is not limited to this package, and is applicable to other types of opto-electronic packages.

Figure 2:
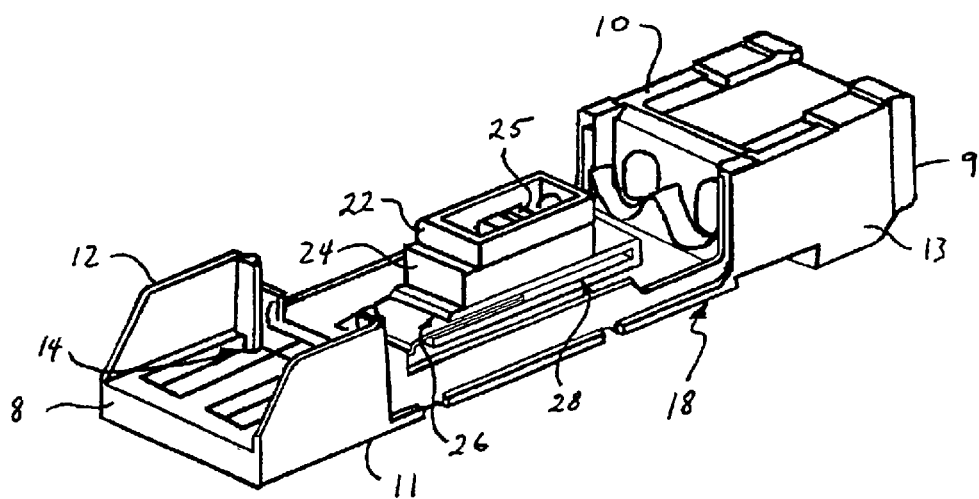
FIG. 2 is a perspective view of the component of FIG. 1, with an access cover of the housing removed to reveal internal components, including an optoelectronic device, also shown with an access cover removed, and a thermoelectric device

Referring now also to FIG. 2, the component 1 has, relative to the insertion direction 6, front and back ends 8,9, top and bottom sides 10,11 sides and left and right sides 12,13. The front end 8 has a port 14 for electrical connections to the component, the back end 9 has two side-by-side optical ports, an optical receive port 15 and an optical transmit port 16. The bottom side 11, part of the top side 10 and about half of the left and right sides 12,13 are formed by a main body 18 of the component 1. Most of the top side 10 and the remainder of the left and right sides 12,13 are formed by a removable cover 20, shown in place in FIG. 1 and removed in FIG. 2.

As can be seen in FIG. 2, the component includes a number of internal components mounted therein, including an optoelectronic device 22, here a laser transmitter device aligned with the transmit port 16, and a thermoelectric device 24. As will be explained in greater detail below, the thermoelectric device 24 is operable in both a heating mode and a cooling mode.

The optoelectronic device 22 is positioned above and bonded directly to the thermoelectric device 24 without any intervening thermally insulating layers, so that these two devices 22,24 are thermally bound to each other.

Normally, such an optoelectronic component 1 for use in a fibre optical data transmission system, would also have inside the housing 2 a second optoelectronic device in the form of a laser receiver device (not shown) mounted to the housing on one side of the laser transmitter device 22 and in alignment with the receive port 15. The construction and use of such receiver devices is well known to those skilled in the art and so will not be further described. However, the principles of the invention may be applied equally to optoelectronic devices such as receive devices.

Figure 3:
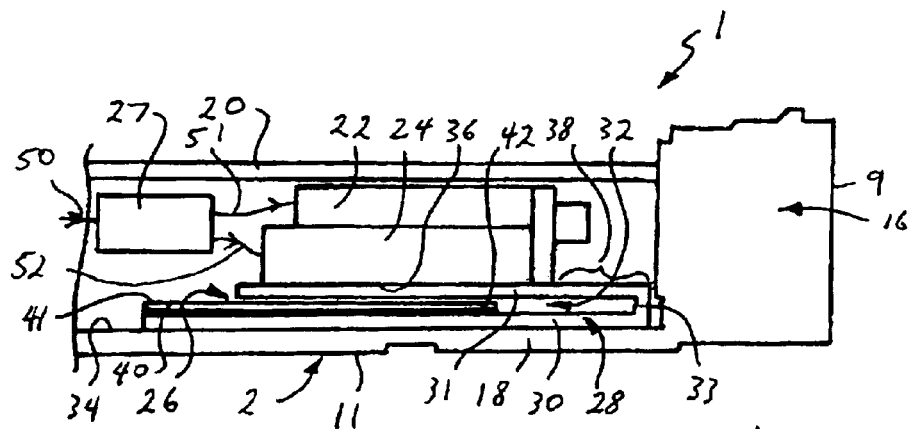
FIGS. 3 and 4 are schematic cross-sections through part of the component of FIG. 2, showing the arrangement of the optoelectronic device, the thermoelectric device, and a variable thermal link having a piezoelectric leaf actuator, which is a movable component that provides a variable thermal coupling between the thermoelectric device and the housing.
Figure 4:
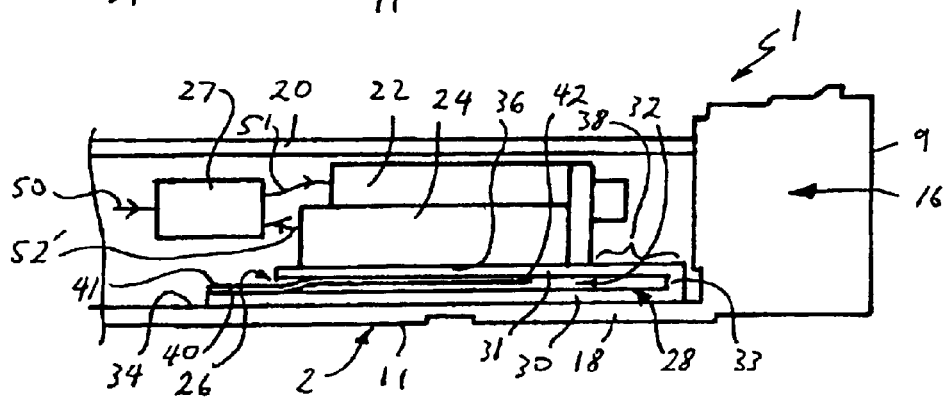

Although not shown for clarity in FIG. 2, as shown in FIGS. 3 and 4, there are interface and control electronics 27, housed inside the housing 2 between the device 22,24 and the electrical port 14. These control electronics 27 and the operation of the optoelectronic component 1 will now be explained in more detail.

The main body 18 serves as a heat sink for dissipating, when necessary, excess heat from the component, in particular heat generated by the operation of the laser transmitter device 22.

The laser device 22 includes a III–V semiconductor laser diode 25 which is capable of operating at a relatively high temperature of 80° C. with an expected lifetime of at least 10 years. The invention takes advantage of this capability to operate a laser diode at relatively high temperatures in order to reduce the total power consumption of the optoelectronic component 1, and to expand the rated external environmental temperature for the component, by making use of a variable thermal link 26 within the housing 2. The thermal link 26 is disposed between the thermoelectric device 24 and a heat sink provided by the main body 18 of the housing 2. The main body 18 is formed from a metallic material with good heat sinking properties, for example aluminum, which has been cast and then subsequently machined as necessary.

The variable thermal link 26 is operable to control a variable thermal coupling between the thermoelectric device 24 and the main body 18.

The thermoelectric device 24 is mounted to the housing main body 18 by a support 28, which provides a limited thermal path between the thermoelectric device 24 and the housing main body 18. The support is preferably U-shaped, having two flat, parallel arms 30,31 separated by a narrow gap 32, which extends in a plane parallel with the lower side 11 of the housing 2. The arms 30,31 extend from a vertex 33 in the direction of the axis 4. The lower arm 30 is joined to an inner upwardly facing surface 34 of the housing main body 18 so that there is a good thermal contact between the lower arm 30 and the housing main body 18. Similarly, the upper arm 31 is joined to a downwardly facing surface 36 of the thermoelectric device 24 so that there is a good thermal contact between the upper arm 31 and the thermoelectric device 24. Ideally, the contact between the upper arm 31 and the thermoelectric device 24 should extend over the full lower surface area 36 of the thermoelectric device to provide the maximum thermal path between the upper arm 31 and the thermoelectric device 24. The contact between the lower arm 30 and the surface 34 needs to be sufficient to hold the assembly of the optoelectronic and thermoelectric devices assembly steady, but need not, and ideally should not, facilitate thermal conduction between the housing 2 and the thermoelectric device 24.

In the first embodiment 1, the thermal path between the lower and upper arms 30,31 is restricted by the relatively small rectangular cross sectional area of the upper arm 31, and a separation distance 38 between the thermoelectric device 24 and the vertex 33. The piece-part consisting of the upper and lower arms 30,31 is made from a high conductivity material, for example copper.

In the first embodiment 1 of the invention, the variable thermal link 26 comprises a movable feature in the form of a leaf-like bi-metallic strip 40 that extends into the narrow slot 32. The leaf or strip 40 is fixed at one end 41 to the inner surface 34 of the main body 18, with a leaf-like opposite end 42 of the strip 40 being free to move inside the slot 32, between a straight orientation as shown in FIG. 3 to a deflected orientation as shown in FIG. 3 in order to provide a variable thermal coupling between the thermoelectric device 24 and the heat sink provided by the housing 2. At temperatures below a predetermined temperature, for example 60° C., the bimetallic strip 40 straightens to the straight orientation in which the strip does not contact the upper arm 31 of the support 28, and at temperatures above the predetermined temperature, the bimetallic strip 40 bends to the deflected orientation to bridge the gap 32 between the lower and upper 30,31 arms, thus providing an enhanced thermal path between the thermoelectric device and the housing main body 18. The bimetallic strip 40 therefore causes the variable thermal link 26 to switch automatically between one mode of operation in which the thermal coupling between the heat sink 18 and thermoelectric device 24 is relatively low, and another mode of operation in which the thermal coupling between the heat sink 18 and thermoelectric device 24 is relatively high. Because there is no active control of the movement of the strip 40, the strip is passively operable to control the variable thermal coupling between the thermoelectric device 24 and the heat sink 18.

The control electronics 27 therefore do not control the operation of the variable thermal link, but to receive input transmit signals 50, to drive the optoelectronic device 51 and to provide power to the thermoelectric device 52 to stabilise the operating temperature of the optoelectronic device.

When the temperature is below the predetermined temperature and the bimetallic strip 40 is not in contact with the thermoelectric device 24, then electric power is provided 52 from the control electronics 27 to the thermoelectric device 24 to heat the optoelectronic device 22, and so to maintain the laser diode 25 at a steady operating temperature of in the region of about 60° to 80° C. To provide heating, the electric power 52 to the thermoelectric device is such that the electrical current flows in one particular direction.

When, on the other hand, the temperature is above the predetermined temperature and the bimetallic strip 40 is in contact with the thermoelectric device 24, then electric power is provided 52' from the control electronics 27 to the thermoelectric device 24 to cool the optoelectronic device 22. To provide cooling the electric power 52' to the thermoelectric device is such that the electrical current flows in a direction opposite to that for heating. In doing so, the side of the thermoelectric device in contact with the optoelectronic device cools, whiles the opposite side 36 is heated, and this heat is then conducted away from the thermoelectric device 24 via bimetallic strip that bridges the arms 30,31 of the support 28 and is ultimately radiated or conducted away by the heat sink provided by the housing 2.

The normal operating temperature of a rack or cabinet into which the component 1 is mounted, will be around 40° C. As a result, the thermoelectric device 24 will for most of the time be used in the heating mode, and with the variable thermal link 26 configured to thermally insulate the thermoelectric device and hence the optoelectronic device 22 from the heat sink provided by the housing main body 18.

Because the thermoelectric device 24 is more efficient in the heating mode than the cooling mode, and because of the variable thermal insulation provided by the variable thermal link 26, the operational temperature range of the optoelectronic component 1 is increased for the same or lower total electrical power consumption, as compared with a similar optoelectronic component in which the optoelectronic device operates at a relatively lower temperature, and the thermoelectric device provides only a cooling effort.

Figure 5:
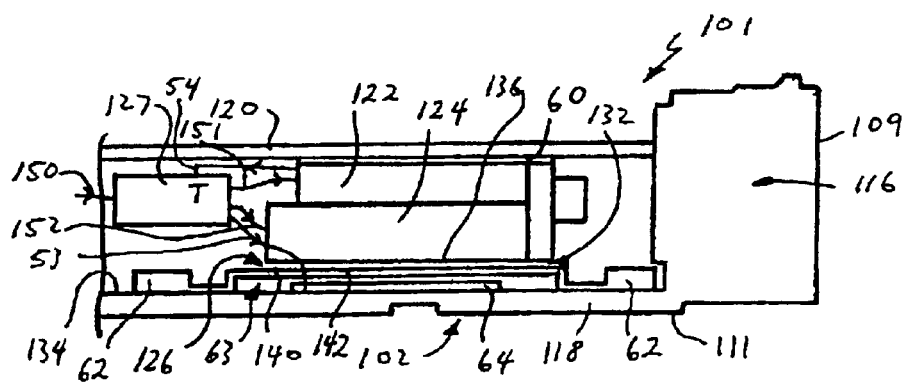
FIGS. 5 and 6 are schematic cross-sections similar to those of FIGS. 3 and 4, showing part of an optoelectronic component according to a second embodiment of the invention with a variable thermal link having a piezoelectric disc actuator that acts on a movable component to provides a variable thermal coupling between the thermoelectric device and the housing.
Figure 6:
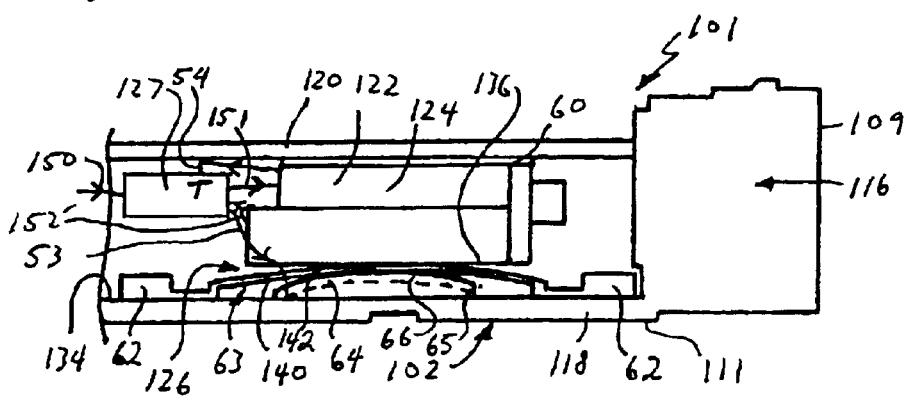

FIGS. 5 and 6 show an optoelectronic component 101 according to a second embodiment of the invention, in which components or features similar to those of the first embodiment 1 are indicated by reference numerals incremented by 100.

The second embodiment 101 differs from the first embodiment 1 in the following ways. First, the optoelectronic device 124 and attached thermoelectric device 126, are not attached to an underlying support, but are supported by a removable cover 120 of the housing 102. In order to thermally insulate the optoelectronic device 124 from the cover 102, which might otherwise act as a heat sink, the optoelectronic device 124 is supported via an intermediate thermally insulating insert 60.

Second, the variable thermal link 126 is provided by a movable feature in the form of a drum element 140 with a central flexible metal membrane 142, which may be disc-shaped or rectangular in plan outline, and which is joined to the housing main body 118 via one or more peripheral feet 62. When the drum membrane 142 is relaxed, as shown in FIG. 5, a gap 132 separates the lower surface 136 of the thermoelectric device 124 from the drum membrane 142. The drum 140 is not passively operable, but is actively operable under the action of a disc-shaped piezoelectric disc actuator 64, which is bonded at its periphery 65 to the inner surface 134 of the housing main body 118 in a void 63 beneath the drum membrane 142, and which is free to bow upwards in a central portion 66 to tension and press the drum membrane 142 against the underside 136 of the thermoelectric device 124 when energised by a high voltage provided 53 by the control electronics 127 when it becomes necessary to switch the thermoelectric device from a heating mode to a cooling mode of operation.

Third, in order to provide a high degree of temperature control, the second embodiment includes inside the optoelectronic device 124 a temperature sensor (not shown), typically a thermistor, which offers low cost, highly accurate means of temperature sensing. The temperature sensor provides a temperature signal output 54 to the control electronics 127. Therefore, when the sensed temperature crosses a predetermined set point, the control electronic activates or deactivates the piezoelectric actuator 64 in order to vary the thermal coupling between the thermoelectric device and the heat sink provided by the housing main body 118. At the same time, the control electronic controls the direction and the amount of current 152,152' provided to the thermoelectric device 124 in order to heat or to cool the optoelectronic component 122 as required to maintain a steady temperature.

Figure 7:
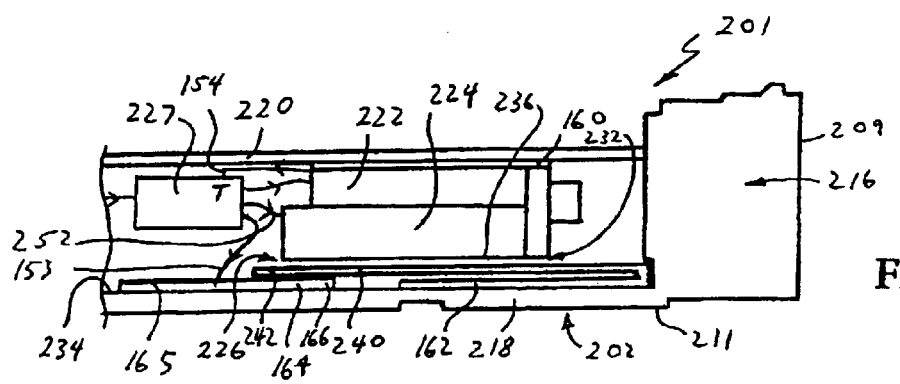
FIGS. 7 and 8 are schematic cross-sections similar to those of FIGS. 3 and 4, showing part of an optoelectronic component according to a third embodiment of the invention with a variable thermal link having a piezoelectric leaf actuator that acts on a movable component to provide a variable thermal coupling between the thermoelectric device and the housing.
Figure 8:
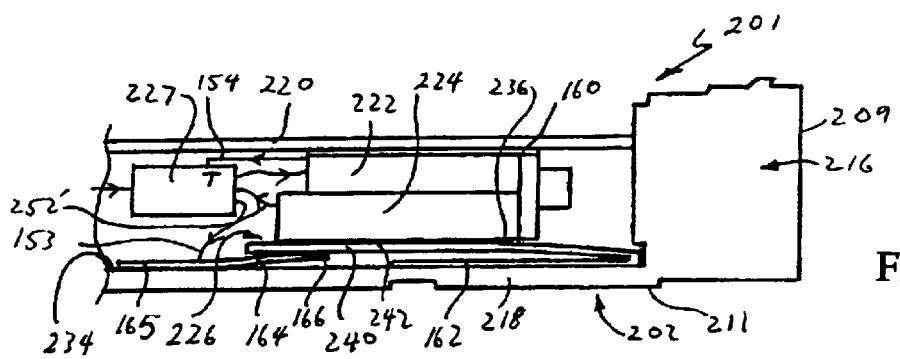

FIGS. 7 and 8 show an optoelectronic component 201 according to a third embodiment of the invention, in which components or features similar to those of the second embodiment 101 are indicated by reference numerals incremented by 100.

The third embodiment 201 differs from the second embodiment 101 in the following way. The variable thermal link 226 includes a movable feature 240 having a flexible metal leaf 242, which is rectangular in plan outline, and which is joined to the housing main body 218 via a foot 62, which is rectangular or square in plan outline. The flexible metal leaf 242 and foot 62 are similar in construction to the upper and lower arms 30,31 of the support 28 of the first embodiment 1, except that in this embodiment 201 the leaf is much more flexible than the upper arm 31. When the metal leaf 242 is relaxed, as shown in FIG. 7, a gap 232 separates the lower surface 236 of the thermoelectric device 224 from the leaf 242. The movable feature 240 is not passively operable, but as with the second embodiment 101 is actively operable under the action of a rectangular-shaped piezoelectric leaf actuator 164, which is bonded at one end 165 to the inner surface 234 of the housing main body 118, and which is free to bow upwards at an opposite end 166 to bend and press the leaf 242 against the underside 236 of the thermoelectric device 224 when energised by a high voltage provided 153 supplied by the control electronics 227 when it becomes necessary to switch the thermoelectric device from a heating mode to a cooling mode of operation.

As mentioned above in relation to the first embodiment 1, the main bodies 118,218 of the second and third embodiments 101,201 are formed from a metallic material with good heat sinking properties, for example aluminum, which has been cast and then subsequently machined as necessary. The respective covers 120,220 may be made from a similar material, but are preferably formed from a material having insulating thermal properties, particularly since in these embodiments the optoelectronic device 122 is to be bonded to the cover 120. Preferably, both embodiments incorporate and additional thermal insulation layer 60,160, between the corresponding optoelectronic devices 122,222 and covers 120,220.

In the second embodiment 101, the variable thermal link is provided mainly by the drum and associated attachment foot or feet 62, although the heat may be conveyed through the piezoelectric disc actuator. In the third embodiment 201, the variable thermal link is provided mainly by the piezoelectric leaf actuator and flexible metal leaf 242, although some heat may be conveyed through the associated attachment foot 162.

The third embodiment 201 is similar to the second embodiment 101 in that each has a movable feature, either a drum membrane 142 in conjunction with a piezoelectric disc actuator, or a flexible metallic leaf 242 in conjunction with a piezoelectric leaf actuator. In both cases there are one or more portions of the movable elements, which are affixed to the housing 102,202, and one or more portions which are movable towards and away from the thermoelectric device 124,224.

One way in which the arms 30,31 of the support 28, or the flexible metallic leaf 242 and associated foot 162 can be formed is with the use of wire electrical discharge machining, which is particularly suitable for forming narrow slots of the order of 50 μm to 150 μm wide in a piece of metal such as stainless steel, brass or aluminum.

Because the optoelectronic components 122,222 of the second and third embodiments 101,201 are joined to the lid 120,220, yet still need to be aligned optically with the transmit port 116,216, it will in general be desirable or necessary to perform a manufacturing alignment of the optoelectronic device in situ after the removable cover 120,220 has been affixed to the housing main body 118,218. One way to do this is to provide some means for adjusting the final position of the optoelectronic component after this has been bonded to the cover, for example with an adjustable component (not shown) that can be accessed and then set in place. Although not illustrated, one way of doing this would be to provide a removable side panel or access port in one of the housing side walls, through which temporary access may be had for alignment purposes. Alternatively, it may be possible to make the final alignment with the cover 120,220 and optoelectronic device 122,222 in place, but not yet finally bonded or joined to the cover. This may be done, for example, by providing a small removable access cover in a side wall of the housing, and then by injecting glue between the removable cover 120,220 and the optoelectronic component 122,222 once alignment has been achieved, and then replacing the small removable access cover once this has been done.

It may in some cases be possible to substitute features of one of the illustrated embodiments for the corresponding feature in another of the embodiments. For example, in the second and third embodiments 101,201, the piezoelectric actuator 64,164 may be substituted by a passively operated bimetallic strip actuator, similar to the bimetallic strip 40 of the first embodiment 1.

The invention is not restricted to bi-metallic strips and piezo-electric actuators as the actuating mechanisms. Other possibilities include SMA (shape memory alloys), for example a shape memory alloy that returns to a remembered state when heated above a critical temperature. This SMA could be placed between the upper and lower arm 30 and 31.

The invention described above provides a number of practical benefits in the operation of an optoelectronic component, which are particularly useful in wavelength division multiplexing (WDM) systems, owing the ability to stabilise the temperature and hence wavelength of an optoelectronic device within the component by means of a variable thermal link and a thermoelectric device used either in a heating mode of operation, or a cooling mode of operation. The invention permits greater efficiencies in energy use and a greater specified temperature operating range for the optoelectronic component for a given amount of permissible electrical power consumption.

What is claimed is:

1. An optoelectronic component, comprising a housing, an optoelectronic device, a thermoelectric device, and a heat sink for dissipating heat from the component, the optoelectronic device and thermoelectric device being mounted within the housing and the thermoelectric device being thermally bound to the optoelectronic device, wherein the thermoelectric device is operable in both a heating and a cooling mode in order to stabilise the operating temperature of the optoelectronic device, and the component includes a variable thermal link, said link being disposed between the thermoelectric device and the heat sink and said link being operable to control a variable thermal coupling between the thermoelectric device and the heat sink, such that the thermal coupling is reduced when the thermoelectric device is used to stabilise the operating temperature of the optoelectronic device by heating the optoelectronic device and relatively increased when the thermoelectric device is used to stabilise the operating temperature of the optoelectronic device by cooling the optoelectronic device, wherein the variable thermal link includes at least one movable feature which moves between a first position in which the thermoelectric device is relatively thermally isolated from the heat sink to a second position in which the thermoelectric device is relatively thermally connected to the heat sink.

2. An optoelectronic component as claimed in claim 1, comprising additionally a temperature sensor and a controller, wherein the temperature sensor is arranged to sense the temperature of the optoelectronic device, the controller is arranged to receive a signal from the temperature sensor and to control in response to said received signal the operation of the variable thermal link in order to control the operating temperature of the optoelectronic device.

3. An optoelectronic component as claimed in claim 1, in which the variable thermal link comprises a movable leaf, which moves to provide the variable thermal coupling between the thermoelectric device and the heat sink.

4. An optoelectronic component as claimed in claim 1, in which the variable thermal link is passively operable to control the variable thermal coupling between the thermoelectric device and the heat sink.

5. An optoelectronic component as claimed in claim 1, in which the variable thermal link is actively operable to control the variable thermal coupling between the thermoelectric device and the heat sink.

6. An optoelectronic component as claimed in claim 5, comprising additionally an actuator for moving the movable feature.

7. An optoelectronic component as claimed in claim 6, in which the actuator comprises a piezoelectric element.

8. An optoelectronic component as claimed in claim 6, in which the actuator comprises a bimetallic strip.

9. An optoelectronic component as claimed in claim 1, in which the movable feature further comprises a portion, which is affixed to the housing, and a portion which is movable towards and away from the thermoelectric device.

10. An optoelectronic component as claimed in claim 1, in which the heat sink is provided by at least a portion of the housing.

11. A method of operating an optoelectronic component at a stabilised operating temperature, said component comprising a housing, an optoelectronic device, a thermoelectric device, a heat sink, a variable thermal link, and a source of electrical power, the optoelectronic device and thermoelectric device being mounted within the housing, the thermoelectric device being thermally bound to the optoelectronic device and the variable thermal link being disposed between the thermoelectric device and the heat sink, wherein the variable thermal link further comprises at least one movable feature, the at least one movable feature moving between a first position in which the thermoelectric device is relatively thermally isolated from the heat sink to a second position, said second position being with the thermoelectric device in a relatively thermal connected position with the heat sink, the method comprising the steps of:

i) supplying electrical power to run the optoelectronic device;

ii) supplying electrical power to the thermoelectric device such that said device is operated in a heating mode to heat the optoelectronic device and stabilise the operating temperature of the optoelectronic device when the temperature of the optoelectronic device is below a desired level;

iii) supplying electrical power the thermoelectric device such that said device is operated in a cooling mode to cool the optoelectronic device and stabilise the operating temperature of the optoelectronic device when the temperature of the optoelectronic device is above a desired level;

iv) using the variable thermal link to control a variable thermal coupling between the thermoelectric device and the heat sink, such that the thermal coupling is relatively reduced when the thermoelectric device is used to heat the optoelectronic device and relatively increased when the thermoelectric device is used to cool the optoelectronic device; and v) using the heat sink to dissipate heat from the thermoelectric device when the thermoelectric device is used to cool the optoelectronic device and when the variable thermal coupling is relatively increased.

* * * * *